United States Patent
Jacobson et al.

(10) Patent No.: US 6,608,771 B2
(45) Date of Patent: Aug. 19, 2003

(54) LOW-POWER CIRCUIT STRUCTURES AND METHODS FOR CONTENT ADDRESSABLE MEMORIES AND RANDOM ACCESS MEMORIES

(75) Inventors: Hans M. Jacobson, White Plains, NY (US); Prabhakar N. Kudva, New York, NY (US); Stanley Everett Schuster, Granite Springs, NY (US); Peter W. Cook, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/933,189

(22) Filed: Aug. 20, 2001

(65) Prior Publication Data

US 2003/0043665 A1 Mar. 6, 2003

(51) Int. Cl.[7] .............................................. G11C 15/00
(52) U.S. Cl. ........................ 365/49; 365/203; 365/204
(58) Field of Search .......................... 365/49, 203, 204; 711/108

(56) References Cited

U.S. PATENT DOCUMENTS 5,740,097 A  *  4/1998  Satoh ........................... 365/49
6,199,140 B1 *  3/2001  Srinivasan et al. ......... 711/108

* cited by examiner

*Primary Examiner*—Richard Elms
*Assistant Examiner*—Jung H. Hur
(74) *Attorney, Agent, or Firm*—Nathaniel I. Wallace

(57) ABSTRACT

A method is provided for associating an address with data. The method includes precharging a matchline connected to a plurality of tag match functions to a first potential, wherein each tag match function comprises one or more match logic devices, discharging two tag lines for a first tag bit to ground, and reading a plurality of tag bits and corresponding data bits onto a plurality of tag lines and a plurality of data lines respectively. The method further includes determining a match between the tag bits and data bits, and pulling the matchline to a second potential upon determining a match for each of the tag bits.

21 Claims, 10 Drawing Sheets

Power consumption for match and mismatch at 204/207 ps delay

| CAM-type | mismatch | match | Total over 16 cycles | Energy Ratio |
|---|---|---|---|---|
| DW-XNOR CAM (204ps) | 654pJ | 3600pJ | 13,410pJ | 20 % |
| Dynamic-CAM (207ps) | 4175pJ | 3500pJ | 66,125pJ | 100 % |

Energy vs. Delay (typical conditions)
(assuming instruction entry granted every 16th cycle)

LOW-POWER CIRCUIT STRUCTURES AND METHODS FOR CONTENT ADDRESSABLE MEMORIES AND RANDOM ACCESS MEMORIES

BACKGROUND OF THE INVENTION

1. Field of the Invention

The present invention relates to semiconductor circuit design, and more particularly towards circuit structures for low power operation of content addressable memories and random access memories.

2. Description of Prior Art

Content addressable memory (CAM) circuit structures are typically used to allow fast and efficient searches, translations, or pattern matching of memory content. CAM provides a general solution to memory searches; unlike standard memories that associate data with an address, a CAM associates an address with data. When data is presented on the inputs of the CAM, the CAM searches for a match for the data in the CAM without regard to address. When a match is found the CAM identifies the address location of the data. In microprocessors, CAMs have been used most notably for tag matching in Translation Lookaside Buffers (TLBs) and associative caches, and to resolve instruction dependencies in rename and issue pipeline stages.

One problem associated with CAMs is power consumption. For example, in a CAM implemented as a dynamic wired XNOR function, where all match transistors are connected to one matchline, the matchline is precharged to a high logic value before evaluating the function. Whenever a mismatch occurs, the matchline is discharged. In situations where mismatches are prevalent, the frequent recharging of the matchline consumes considerable power. This high power consumption limits the physical size of CAMs and also limits its use in low power applications.

Recent work has proposed cascaded matching logic, where the match transistors are connected in serial to form an AND function rather than a wired XNOR function. This scheme prevents the matchline from being discharged every cycle when a mismatch occurs, thereby reducing power consumption. In order to provide high speed matching, a sense-amp can be added to the output. Alternatively, the AND function is decomposed into several sub-functions. While these methods reduce power consumption by reducing the frequency of precharging the matchline node, both of these approaches introduce additional sources of power consumption by introducing short circuit currents (sense-amp in its linear region) and/or internal nodes (decomposed AND function) that need to be charged and discharged. An AND function also introduces additional gate capacitance as extra transistors (static logic) and/or larger transistors (high stack domino logic) are introduced.

The main problem with the AND function approach however is that it is not as scalable as the wired XNOR approach. In an AND function the transistor stack height is dependent on the number of tag-bits that are to be matched. The delay of the logic (R*C) increases quadratically with stack height as capacitance (C) and resistance (R) is added for each additional transistor. In a wired XNOR function, the delay increase is linear with number of tag-bits, as only capacitance (but not resistance) is added to the critical path.

Referring to power consumption in dynamic wired XNOR match logic, one problem is the logic that interfaces to the match result. If the match result is connected to static logic, then intermediate nodes in the logic function may also be charged and discharged each cycle due to the precharging and discharging of the matchline node, unnecessarily wasting power. If dynamic logic is used, then it needs to be triggered by an evaluation signal rather than by the data signals (match results) themselves. This "sampling" of the data signals introduces extra delay overhead as safety margins need to be used to ensure that the domino logic is not evaluated before all data signals have reached their final value. Sampling also introduces additional power dissipation as the extra gate capacitance of the evaluation transistor of the domino logic needs to be driven each cycle. Referring to interfacing with logic dependent on the match result, the main problem with the dynamic wired XNOR match logic is that it generates an event on the matchline when there is not a match, rather than when there is a match.

Accordingly, it would be desirable to add the low power advantages of the AND function approach to the speed advantages of the dynamic wired XNOR function. Circuit structures that can combine these two features are presented in this text.

Random Access Memory (RAM) circuit structures are mainly used to efficiently store and read data. However, RAM structures generally have high power consumption due to precharging and discharging of high capacitance bitlines every cycle a read takes place. In addition, when sense-amps are used, two bitlines, data and data', are needed, further increasing power consumption. Fast sense-amps also consume significant power as the sense transistors are put in their linear region in order to react quickly to a voltage drop on one of the bitlines, creating short-circuit current. If sense-amps are not used, the read operation may be significantly slowed due to the time it takes for the size limited read and storage transistors to discharge the bitline. This text presents an alternative fast low power solution to this problem by reducing the capacitance on the bitlines through banking.

SUMMARY OF THE INVENTION

According to an embodiment of the present invention, a method is provided for matching two data sources through a wired exclusive-nor (XNOR). The method includes discharging a first tag line and a second tag line associated with a first tag bit, and precharging a matchline, connected to a plurality of tag match functions to a first potential, wherein each tag match function comprises one or more match logic devices. The method includes reading a plurality of tag bits, including the first tag bit and corresponding data bits, onto a plurality of corresponding tag lines and data lines respectively, and determining a match between each tag bit and data bit, wherein the matchline is pulled to a second potential upon each match logic device indicating a match, and wherein the matchline being held at the first potential upon any match logic device indicating a mismatch.

Each match logic device has a pulling strength, wherein the pulling strengths are ratioed, the match logic devices pulling to the first potential being stronger than the match logic devices pulling to the second potential, wherein upon the match logic devices simultaneously pulling to different potentials, the matchline is clamped at the first potential.

The method further.comprises pulsing a tag line by resetting the tag line to a logic 0 after the match logic devices have evaluated whether the corresponding tag bit has a logic value of 1. Pulsing a tag line further comprises latching a tag bit, and resetting a latch to a value of logic 0 upon determining the tag bit to be a value of logic 1 after the match logic devices have evaluated whether the corresponding tag bit has a logic value of 1. The method includes pulling the matchline partially towards the second potential upon determining a match for each tag bit, and pulling the matchline to the second potential using a sense-amplifier.

The XNOR function is a static wired XNOR function, and the method further comprises pulling, with at least one tag match function, the matchline to the second potential upon evaluating a match, and pulling, with at least one tag match function, the matchline to the first potential upon evaluating a mismatch, wherein the matchline implements a static wired XNOR function.

The wired XNOR function is implemented as a dynamic XNOR-AND function, and the method includes pulling, with a set of tag match functions, to the first potential, and pulling, through an AND structure of tag match functions, to the second potential, wherein one or more tag match functions are connected to one another in series forming an AND(XNOR(tag[i]), . . . ,XNOR(tag[i+j])) function, where i and j indicate the corresponding tag bits of the tag match functions.

The first potential is ground and the second potential is VDD. Alternatively, the first potential is VDD and the second potential is ground.

The method includes storing a plurality of data entries in a memory, wherein a matchline with associated match logic is replicated for each data entry, storing a tag in a latch, implementing, through the memory and the match logic, a content addressable memory, and implementing, through the matchline of each data entry, a wake up function.

The method includes inhibiting the evaluation of a matchline, wherein the content addressable memory device comprises a gating device connected to a tag valid signal and a clock for gating the clock to the tag latch, thus avoiding latching a new tag when the tag is invalid thus inhibiting the evaluation of the corresponding matchlines.

The precharge signal of each matchline is a clock. The precharge signal of each matchline is a delayed derivative of the matchline signal such that a self-resetting structure is implemented.

According to an embodiment of the present invention, a method of inhibiting the evaluation of a matchline of a content addressable memory device is provided. The method comprises gating a clock to a tag latch using a tag valid. signal, latching the tag valid signal, gating a precharge signal to a matchline using the latched tag valid signal, propagating a matchline value unchanged through a clearing device while the tag valid signal indicates that the tag is valid, and discharging the output of the clearing device while the tag valid signal indicates that the tag is invalid.

The method includes determining a wake up of a plurality of data entries through a ready logic, and discharging the output of the ready logic upon deassertion of a latched tag valid signal.

A method of reading a banked random access memory is provided according to an embodiment of the present invention. The method includes precharging a plurality of banked bitlines to a first potential, precharging an OR device connected to each banked bitline to a second potential, and applying a plurality of data and read signals to the read devices of each banked bitline. The method further includes pulling a banked bitline to the second potential upon a read device reading a data value matching the second potential, and evaluating the output of the OR device to.the first potential upon one or more banked bitlines being pulled to the second potential.

According to an embodiment of the present invention, a banked random access memory is provided, including a plurality of read devices connected in parallel to a read bitline, wherein each read device is further connected to a data signal and a read signal, each read device propagating a value of the data signal upon assertion of the read signal, a plurality of banks, each bank comprising a plurality of read devices connected in parallel to a read bitline, wherein the read bitline of each bank is precharged to a first potential, and a precharged OR-device connected to the read bitlines.

The OR-device is precharged to a second potential, the OR-device output is pulled to the first potential upon any read bitline being pulled to the second potential by a read device, and the OR-device output remaining at its precharged potential upon all read bitlines remaining at the first potential.

The precharge device of each bank bitline being activated by a delayed derivative of the bitline value, the precharge device of the OR-device being activated by a delayed version of the output of the OR-device such that a self-resetting precharged banked random access memory is implemented.

According to an embodiment of the present invention, a wake up device which detects source operands. The wake up device includes a content addressable memory based on a wired XNOR match function, including at least two tag lines for receiving data from a results tag latch and a tag drive, a first tag bit and data bit connected to a first match function, the first match function pulling to a first potential upon evaluating a match, at least a second tag bit and data bit connected to a second match function, the second match function pulling to a second potential upon evaluating a mismatch, and a precharged matchline connecting the tag match functions, pulling to the second potential, the precharged value adapted to indicate a mismatch of the matchline function.

The content addressable memory is dynamic wired XNOR based. The content addressable memory is static wired XNOR based and further comprises a first tag bit and data bit input to a first tag match function, the first tag match function pulling to a first potential upon a match, the first tag bit and data bit input to a second tag match function, the second tag match function pulling to a second potential upon a mismatch, and at least a second tag bit and data bit input to a third tag match function connected to the second potential, the third tag match function pulling to the second potential upon a mismatch.

The content addressable memory is dynamic wired XNOR-AND based, and includes a logic structure based on an AND function including a plurality of XNOR tag match functions each connected to an associated tag bit and data bit, the tag match functions connected in series, the logic structure pulling to the first potential upon all tag match functions in the logic structure indicating a match of their corresponding tag bit and data bit. The content addressable memory further includes zero or more successive tag match functions connected to associated tag bits and data bits, the tag match functions pulling to the second potential upon a mismatch, an end of the AND logic structure connected to the matchline, and a precharge transistor connected to a precharge signal, the matchline, and to the second potential for pulling the matchline to the second potential.

The wake up device further comprises an AND function connected to a tag valid signal and a clock for gating the clock to the results tag latch.

The wake up device includes a ready logic in the form of a plurality of transistors each connected to a content addressable memory matchline, wherein the transistors are connected in parallel-series stacks forming a domino gate, wherein a first end of the OR-AND gate is connected to a footing transistor, the footing transistor further connected to a precharge signal and to the second potential, and a second end of the gate connected to an output node, a precharge transistor connected to the output node, a precharge signal, and the first potential, the ready logic detecting the matching of multiple entries in the content addressable memory.

The first potential is ground and the second potential is VDD. Alternatively, the first potential is VDD and the second potential is ground.

According to an embodiment of the present invention, a wake up device is provided for detecting source operands. The wake up device includes a content addressable memory, a clock signal applied to an AND logic device, a tag valid signal applied to the AND logic device, the AND logic device gating the clock signal, and a tag latch receiving the gated clock signal.

The content addressable memory includes one of a dynamic wired XNOR based match function, a static wired XNOR based match function, and a dynamic wired XNOR-AND based match function.

The wake up device further comprises a latch adapted to latching a tag valid bit onto an internal valid node, a plurality of reset logic devices, each connected to the internal valid node, a content addressable memory matchline, and a unique output node, and a second AND logic device connected to the internal valid node and an inverted clock signal with an output adapted to gate the precharge transistor of a matchline.

The wake up device further comprises a passgate connected to a clock, a tag bit, and an internal tag bit node, a latch comprising two transistors in series connected to the clock, the internal tag bit node, a second potential, an output node, and two transistors in series connected to the clock, the internal tag bit node, a first potential and the output node, and a reset transistor connected to a feed back tag drive signal, the first potential, and to the internal tag bit node.

The first potential is ground and the second potential is VDD. Alternatively, the first potential is VDD and the second potential is ground.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

One embodiment of the present invention provides a low-power circuit structure for instruction wake up in the context of a high-speed issue unit (IU), however, it is to be understood that the logic according to the present invention can be implemented in a variety of circuits.

It is to be understood that the present invention may be implemented in various forms of hardware, firmware, special purpose processors, or a combination thereof. Preferably the invention is implemented on an integrated circuit such as an ASIC or microprocessor. Given the teachings of the present invention provided herein, one of ordinary skill in the related art will be able to contemplate these and similar implementations or configurations of the present invention.

Figure 1:
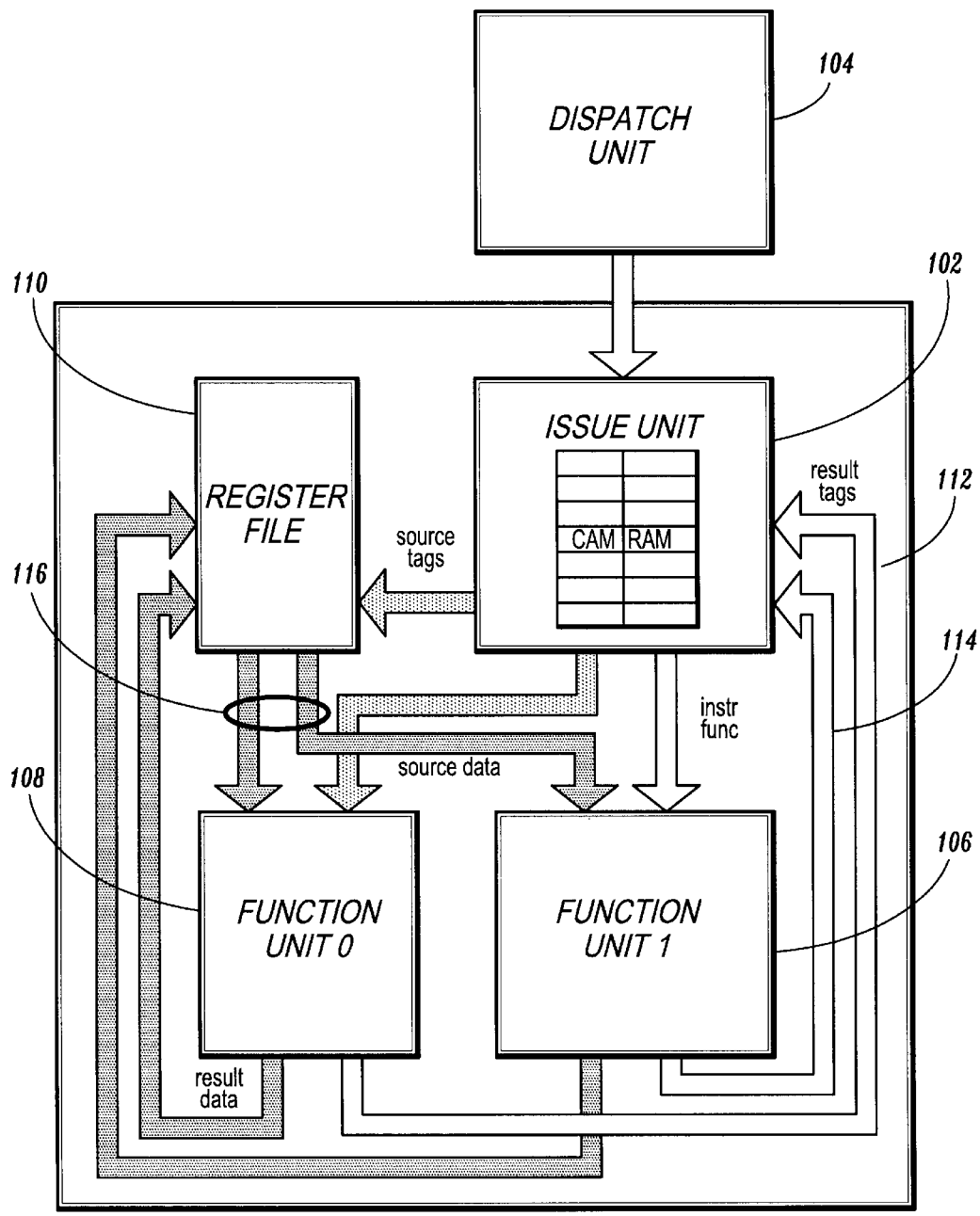
FIG. 1 is an illustrative diagram of an issue unit with surrounding pipeline stages according to one embodiment of the present invention.

The IU and the surrounding pipeline stages are illustrated in FIG. 1 (load/store units not shown). While the logic according to the present invention is depicted in an IU, it is to be understood that the logic according to the present invention can be implemented in any part of an integrated circuit that is making use of CAM and RAM circuit structures. The IU 102 interfaces to a dispatch unit 104, in the processor pipeline from which the IU 102 receives a set of instructions every cycle. The IU 102 also interfaces to two functional units (106 and 108) in the execution stage of the microprocessor pipeline. The IU 102 can issue a maximum of two instructions per cycle to these functional units, but each functional unit can only be issued one instruction per cycle. For each cycle the IU 102 receives two destination tags (112 and 114) from the execution stage, identifying which registers the results of the previous instructions are written to. The IU 102 also interfaces to the register file 110. During each cycle a maximum of two instruction are selected for issuing, the IU 102 sends the source operand tags for those instructions to the register file 110. The register file 110 reads the source operand values corresponding to the tags and places the operand values on a bus 116 to the functional units.

When an instruction is received from the dispatch unit 104, it is accompanied by bits indicating whether the respective source operands are already available in the register file 110, or will be produced by instructions which have not yet produced a result. In one embodiment of the present invention the instructions are accompanied by three bits, since the instructions have up to three source operands.

The IU 102 monitors result tags (112 and 114) from the execution stage and records the results. Once all source operands become available in the register file for an instruction, the instruction can be issued. Instructions are selected for issue each cycle by an arbitration process based on priority criteria (e.g., position based). Once an instruction has been issued to the execution stage, its entry in the IU is removed.

The IU includes an issue queue holding the instructions waiting to be issued, a wake up device for detecting when all source operands become available in the register file, a selection logic for determining which instructions to issue each cycle, and a write logic that determines which entry in the queue instructions should be written to. This disclosure will consider low power circuit structures for the instruction queue storage (RAM), and wake up (CAM +ready logic).

Figure 2:
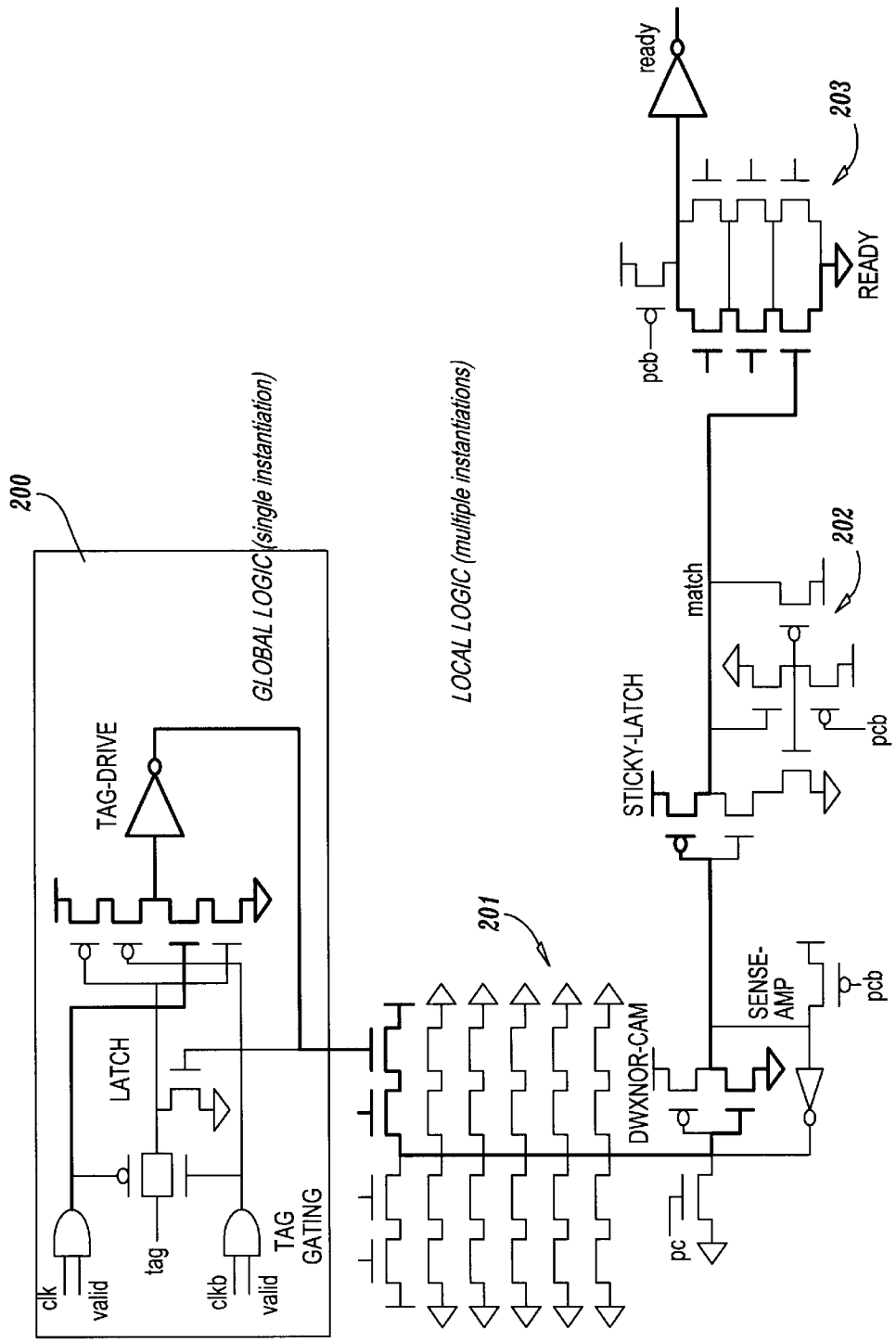
FIG. 2 is a circuit diagram of a datapath for wake up device according to yet another embodiment of the present invention.

A structural overview of the wake up device developed as part of this disclosure is illustrated at the transistor level in FIG. 2. The individual parts of the wake up device will be discussed in detail in the following sections with respect to FIGS. 1 through 10.

In an issue unit (IU), the wake up device is responsible for detecting when all source operands for a given instruction become available. Once all operands are available, the instruction can take part in the arbitration process to get selected for issue. The wake up process can be logically divided into two parts. The first logical division is a tag matching part for detecting when resultant data produced by previous instructions becomes available by comparing the result tags from the execution units to the source operand tags of the instructions in the issue queue. The second division is a ready part for determining when all source operands for a given instruction become available.

In the proposed IU design, the tag matching is performed by a content addressable memory (CAM) structure 201, and the ready generation is performed by an OR-AND domino gate 203. Low-power circuit structures for the CAM 201 and ready parts 203 are discussed in detail below. The present invention combines the low power advantages of AND function based tag match logic and the speed advantages of dynamic wired XNOR (DW-XNOR) function based tag match logic by employing a pulsed wired XNOR function based tag match logic for CAMs.

Figures 3A, 3B, 3C, 3D:
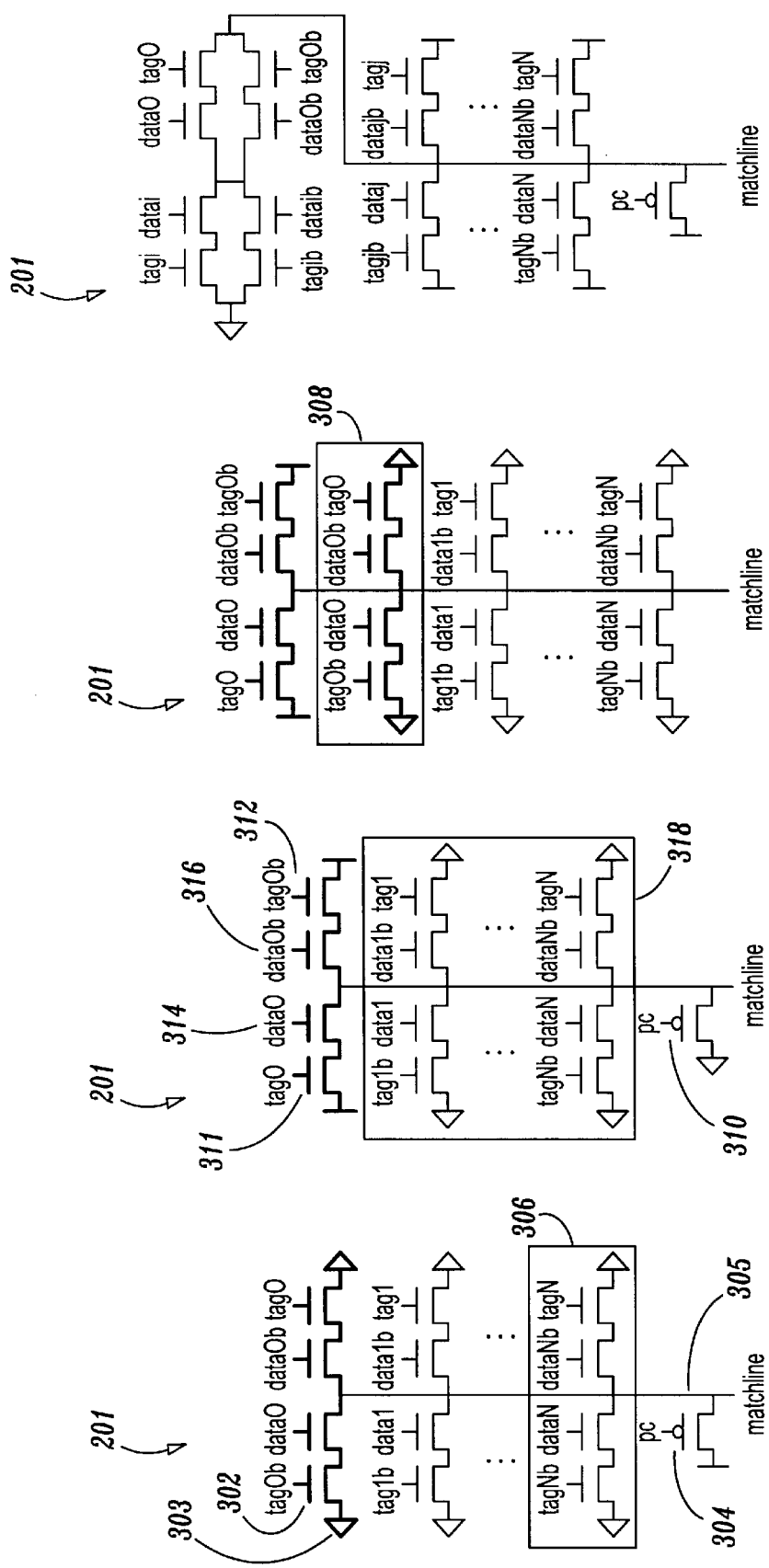
FIG. 3a is a circuit diagram of a dynamic wired XNOR CAM match logic.
FIG. 3b is a circuit diagram of a dynamic wired XNOR CAM match logic according to one embodiment of the present invention.
FIG. 3c is a circuit diagram of a static wired XNOR CAM match logic according to another embodiment of the present invention.
FIG. 3d is a circuit diagram of a dynamic wired XNOR-AND CAM match logic according to still another embodiment of the present invention.

FIG. 3a illustrates the circuit structure of a match logic device in a DW-XNOR based CAM according to prior art. Before a search (match) operation is performed, the tag lines, tag0 to tagN and tag0b (302) to tagNb are discharged to ground (GND). The matchline 305 is precharged high (VDD) through the precharge transistor 304. The search operation is initiated by reading values onto the tag lines (e.g., 302). When a mismatch between a data value and a tag bit occurs, e.g., if the tag bit is different from the stored data bit, the associated transistor stack in the tag match function conducts and the matchline 305 is pulled low, indicating a mismatch. If all tag bits match the stored data values the matchline 305 remains high indicating a match.

FIG. 3b illustrates the circuit structure of a match logic device in a DW-XNOR based CAM according to the present invention. As illustrated in FIG. 3c the match logic device can be made static by adding an extra tag match line for mismatches 308 for tag bit 0. As compared to a static match logic device, a dynamic match logic device needs less capacitance to drive (although a precharge transistor 310 needs to be added). The fully static match logic is analogous to the dynamic logic in function and interface considerations. The DW-XNOR CAM match logic will hereafter be referred to as DW-XNOR match logic.

Note that compared to the prior art DW-XNOR function, for tag-bit 0, tag and

have been exchanged, and the match logic source is VDD (voltage high or a voltage near Boolean 1). A search (match) operation works as follows. The matchline is initially precharged to ground through the precharge transistor, and the tag lines for tag bit 0 are discharged to ground. The search operation is initiated by reading values. (result tags) onto the tag bit lines. If all tag bits match the corresponding data bits (tag-bit[i]==data-bit[i], i=0 . . . N, where N+1 is the number of bits in the tag), the matchline is pulled high by one of tag-bit 0's match transistor stacks (no stacks of tag-bits 1 . . . N will conduct), indicating a match. When not all tag bits match, then either: 1) tag-bit 0's match transistor stacks do not conduct (if tag-bit[0]!=data-bit[0]); or 2) one of tag-bit 0's match transistor stacks conduct and one or more of tag-bits 1 . . . N match transistor stacks conduct (if exists: tag-bit[i] !=data-bit[i], i=1 . . . N). In either case, the matchline remains low (the tag-bit 1 . . . N match transistor stacks connected to ground will drain any current from a conducting tag-bit 0 match transistor stack) when there is a mismatch.

A short circuit is possible in the DW-XNOR match logic whenever tag-bit[0]==data-bit[0] and tag-bit[i] !=data-bit[i] for some i between 1 and N. Prolonged short circuits are not desirable because of increased power consumption. However, for a mismatch, short circuits occur in less than half of the instances where the above condition exists, because in one half of the instances the match logic for tag-bit 0 will not conduct, and in other instances the match logic for all tag-bits from 1 to N will not conduct, therefore, no short circuit condition will exist for these instances.

Figure 10C:
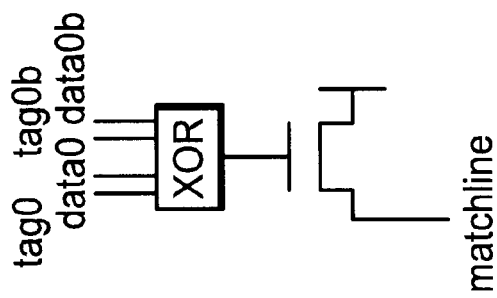
FIG. 10c is a circuit diagram for a third specific tag match line implementation according to an embodiment of the present invention.
Figure 10B:
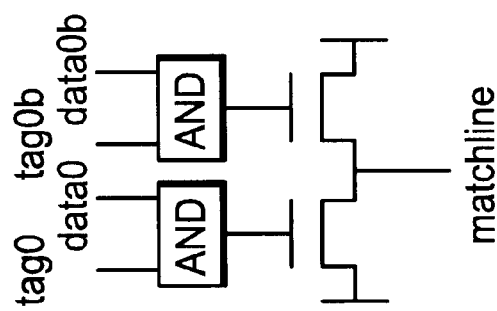
FIG. 10b is a circuit diagram for a second specific tag match line implementation according to an embodiment of the present invention.
Figure 10A:
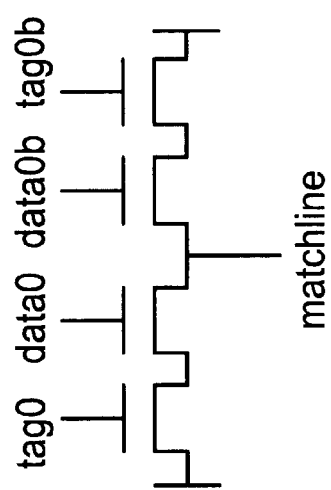
FIG. 10a is a circuit diagram for a specific tag match line implementation according to an embodiment of the present invention.

FIG. 10 illustrates three different examples for implementations of tag match functions. Referring to FIG. 10a, the match logic implements an XOR function through two devices. Each device includes two transistors stacked in series. The gates of the transistor stacks are connected to the tag bit and data bit. The source of each device is connected to one of VDD and ground, and the drain of each device is connected to the matchline, such that a dynamic XOR function is implemented.

As depicted in FIG. 10b, the match logic can implement an XOR function through four devices, divided into two groups. The groups are connected in parallel, the first device of each group implementing the function of a static or dynamic AND or NAND gate, and the second device implementing a transistor. The output of the first device is connected to the gate input of the second device, the source of the second device is connected to one of VDD or ground,.and the drain of the second device is connected to the matchline.

The match logic implements an XOR function through two devices, as shown in FIG. 10c, the devices connected in series. The first device implements the function of a static or dynamic XOR gate, and the second device is a transistor. The output of the first device is connected to the gate input of the second device, the source of the second device is connected to one of VDD or ground, and the drain of the second device is connected to the matchline.

Referring to short circuit conditions, if tag-bit 0 is turned on for as long as it takes to charge the match line during a match, at least that much power will be consumed during a short circuit as well. The maximum power savings in the matchline in such a case cannot be more than half compared to a prior art CAM. To save additional power, the tag lines for tag-bit 0 can be pulsed. This is achieved by employing a self-resetting latch for the tag lines for tag-bit 0, e.g., 200, FIG. 2. Thus, the matchline is only pulled partially high by the match logic, and a passive cross-coupled inverter sense-amplifier is used to pull the match line to VDD. Note that other types of sense-amplifiers can also be used. Pulsing tag-bit 0 means that the possible short circuit current will only exist for a limited time, for example, about three inverter delays for the self-resetting latch illustrated in FIG. 4a. Whenever the tag line 402 goes high, the reset transistor 404 in the latch will conduct and reset the internal tag node 406. One with ordinary skill in the art will appreciate that structure of the circuit can be modified such that the reset transistor 404 conducts upon the tag line 402 of a tag drive 401 going low. As pulsed logic is more sensitive to variations in transistor size and voltage supply than non-pulsed logic, care has to be taken when implementing the CAM match logic of the present invention.

Figure 4A:
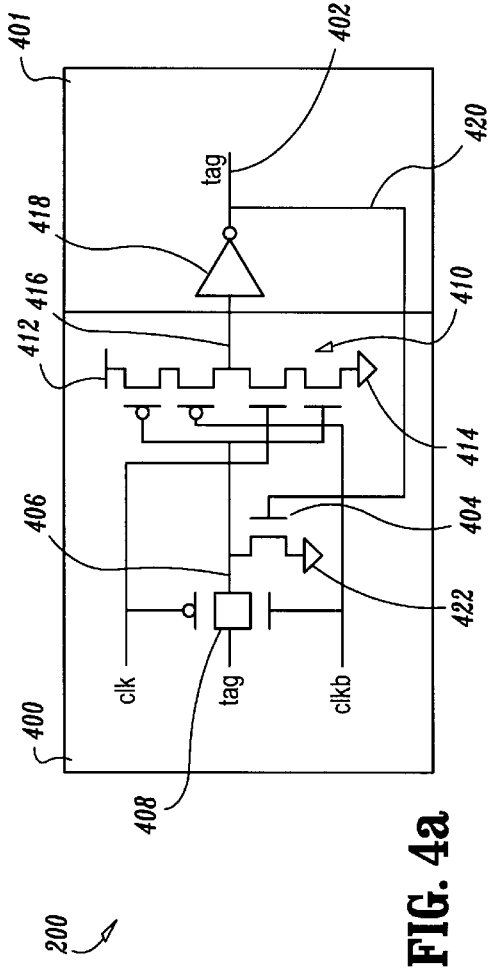
FIGS. 4a–4c are circuit diagrams of self-resetting latches according to an embodiment of the present invention.
Figure 4C:
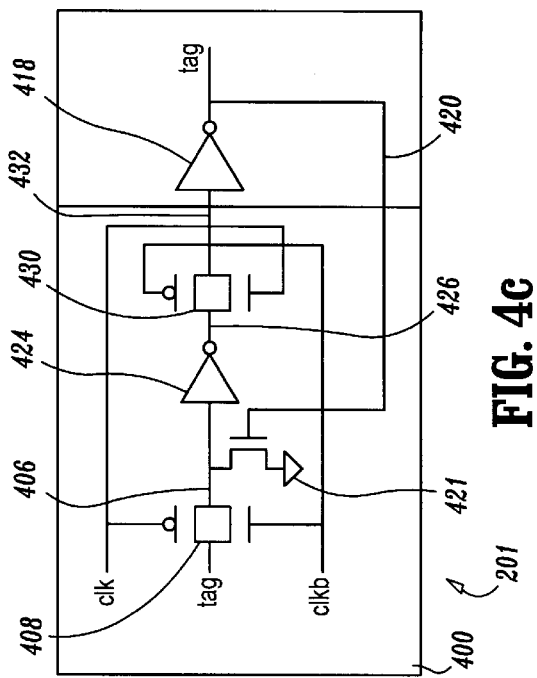
Figure 4B:
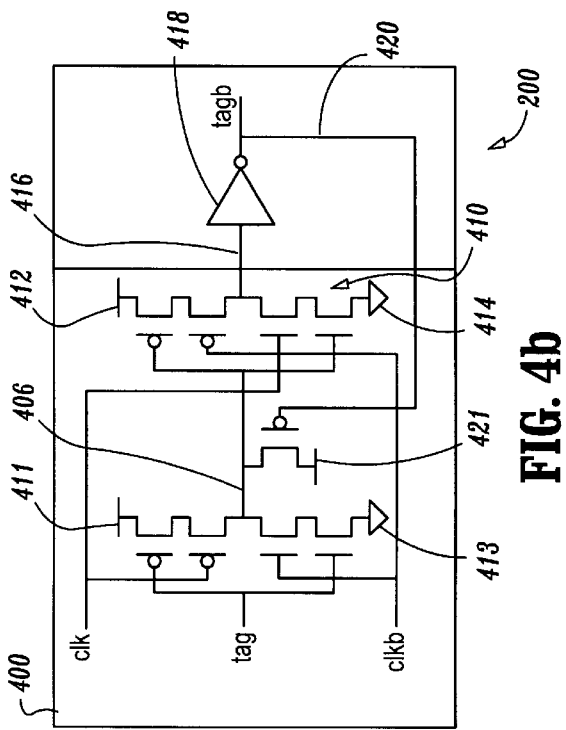

FIGS. 4a–4c show variations of a self-resetting master-slave latch 400, however other embodiments may be contemplated by one with ordinary skill in the art without departing from the scope of the present invention. Referring to FIG. 4a, the self-resetting latch 400 includes a passgate 408 connected to a clock (clk & clkb), a tag bit (tag), and an internal tag bit node 406. The self-resetting latch 400 includes a latch 410 comprising two transistors in series connected to the clock (clk) and the internal tag bit node 406, and two transistors connected in series to the clock (clkb) and the internal tag bit node 406. The latch 410 is connected to VDD 412, ground 414, and output node 416 connected to a tag drive buffer 418, a feed back 420 connected to a reset transistor 404, ground 422, and to the internal tag bit node 406.

The wake up device depicted in FIG. 4b includes a self-resetting latch 400 comprising two transistors in series connected to the clock (clk), and to the tag bit signal (tag), and two transistor is series connected to the clock (clkb), and to the tag bit signal (tag), VDD 411, ground 413 and an internal tag bit node 406. The self-resetting latch 400 further includes a latch 410 comprising two transistors in series connected to the clock (clk) and the internal tag bit node 406, and two transistors connected in series to the clock (clkb) and the internal tag bit node 406, VDD 412, ground 414, and an output node 416 and a tag driver buffer 418 connected to a feed back signal 420 connected to a reset transistor connected to VDD 421 and to the internal tag bit node 406.

Referring to FIG. 4c, the wake up device includes a self-resetting latch 400 comprising a passgate 408 connected to a clock (clk & clkb), a tag bit (tag), and an internal tag bit node 406, an inverter 424 connected to the internal tag bit node 406 and a second internal node 426. The self-resetting latch 400 includes a latch comprising a passgate 430 connected to a clock (clk & clkb), the second internal node 426, and a third internal node 432 connected to a second inverter (tag drive buffer) 418. The second inverter 418 is connected to the output node 420. The second inverter 418 is a tag drive. The output tag line 420 is fed back and connected to the gate of a reset transistor which is connected to ground 421, and the internal tag bit node 406.

Figure 5C:
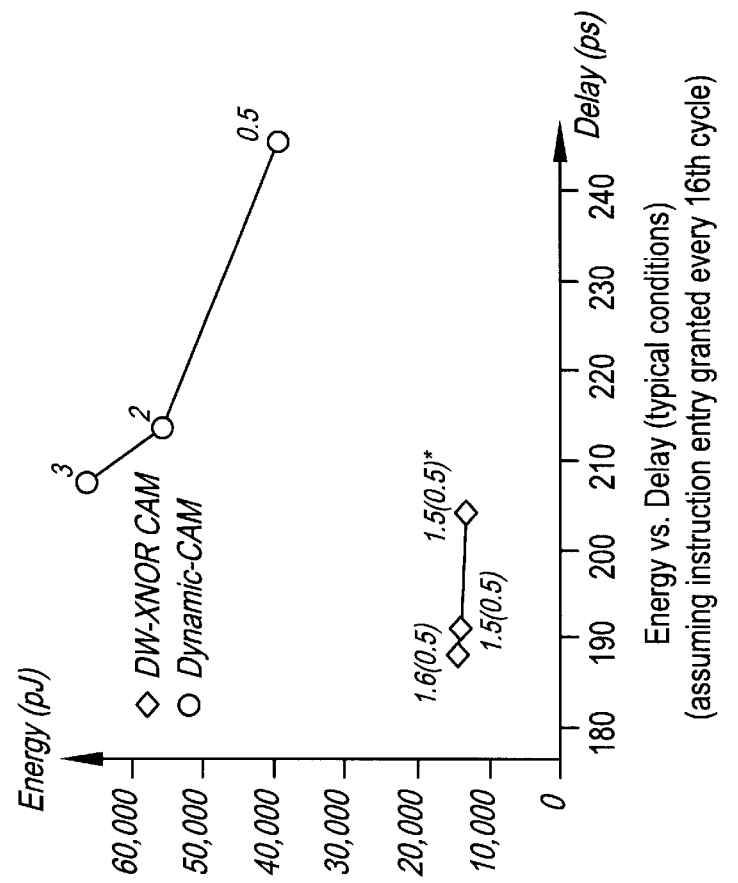
FIG. 5c is a graph of the power consumption for a 32 entry CAM between the CAM logics depicted in FIGS. 5a and 5b as used in an issue queue issuing two instructions per clock.
Figure 5A:
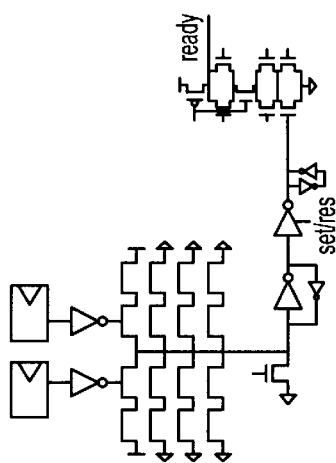
FIG. 5a shows a circuit diagram for a dynamic XNOR CAM according to an embodiment of the present invention.
Figure 5B:
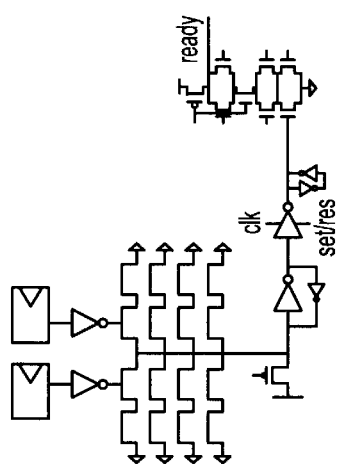
FIG. 5b shows a circuit diagram for a dynamic XNOR CAM.

FIG. 5 illustrates a comparison of the power consumption between the DW-XNOR CAM of the present invention and a prior art DW-XNOR CAM. FIG. 5b shows power and delay results for a 32 entry CAM including tag latch and tag-line drive. As illustrated by FIG. 5a, a DW-XNOR CAM of the present invention including tag latch and tag-line drive consumes on average about 20% of the power of a prior art DW-XNOR CAM at the same matching delay. These power savings may improve further if alternate circuit structures (FIG. 3d) and tag-gating (discussed below) are implemented.

There are several power saving features of the DW-XNOR CAM of the present invention. For example, only the tag lines for tag bit 0 need to be cleared every cycle, the tag lines for tag bits 1 . . . N do not need to be cleared (as they need to be in prior art CAMs). In addition, if mismatches are prevalent then the DW-XNOR CAM consumes less power since over half the time the match logic for tag bit 0 does not conduct and no power is consumed with respect to the match line, and when the match logic does conduct, the power consumed is comparable to charging the match line to about only half of VDD (depending on the tag line pulse width). This compares to prior art DW-XNOR CAMs which has to discharge and charge the match line every time a mismatch occurs. In addition, the precharge transistor only needs to be driven once a match occurs for a DW-XNOR CAM of the present invention while it has to be driven every mismatch cycle for a prior art DW-XNOR CAM.

Further, while the power saving features of the DW-XNOR CAM of the present invention due to not having to clear all tag lines and not having to precharge and discharge the matchline every cycle are important, there are a number of other advantages. For example, a DW-XNOR CAM of the present invention solves the interface problem faced by prior art XNOR CAMs by generating an event on the matchline only when there is a match, rather than every time there is not a match. Subsequently, no sampling of the data signals by a clock is needed, and subsequent domino logic (e.g., 203, FIG. 2) can be triggered directly by the matchline result rather than by a clock signal. This saves power by not having to drive the sampling transistor every clock cycle. If the DW-XNOR CAM of the present invention is interfaced to static logic instead power is also saved since a prior art dynamic XNOR CAM would charge and discharge internal nodes of the static logic on every mismatch while the DW-XNOR of the present invention does not.

As noted above, in prior art dynamic XNOR based CAM structures, all tag-lines need to be cleared before precharge of the matchline can begin in order to avoid short circuit current. In the proposed DW-XNOR based CAM of the present invention, the tag-lines (other than for tag-bit 0)do not need to be cleared before precharge of the matchline because the match logic for all tag-bits other than tag-bit 0 pull to the same voltage as the precharge transistor. Note that a fully static wired XNOR CAM of the present invention does not need a precharge transistor if it interfaces to static logic. However, depending on how the tag-line clear of tag-bit 0 is implemented, a precharge transistor may be needed if the fully static wired XNOR CAM match logic interfaces to domino logic, in this case the match line may have to start out low every cycle. By not having to clear all tag-lines, the DW-XNOR CAM of the present invention can save additional power if the tag-bits latched next cycle are similar to the previous ones and thus not all tag lines will change value.

Another advantage of the DW-XNOR match logic is that smaller transistors can be employed. Because N-mos transistors pull to ground stronger than they pull to VDD, the match logic for tag-bits 1 . . . N can be sized smaller than the match logic for tag-bit 0. This saves power as less gate capacitance is needed to drive on the tag-lines for tag-bits 1 . . . N.

A CAM cell and its associated wired XNOR match logic can be implemented in a variety of ways. The low power DW-XNOR match logic of the present invention can be readily used with a CAM cell and match logic that relies on active pull-up or pull-down with only a slight modification—for tag-bit 0: exchange tag and tag' (or data and data'), and change polarity of the match logic source voltage. The match logic for tag-bits 1 to N is not altered.

The logic used in a dynamic XNOR based CAM to clear the tag-lines can also be used in the DW-XNOR based CAM to clear the tag-lines of tag-bit 0 simply by connecting the clear logic to a fed back version of the tag-line rather than the clock.

The DW-XNOR CAM match logic of the present invention can also implement P-mos transistors for bit 0. Since P-mos pulls to VDD better than N-mos, smaller sized transistors can be used for bit 0. However, in this case, P-mos versus N-mos transistor drive strength needs to be tracked since the match function uses ratioed logic device sizes. These deviations can result in a difference in drive strength of up to 20%. Using devices of one type ensures that transistor drive strength tracks very closely (within a few percent), for example, using only N-mos devices.

According to an embodiment of the present invention, the DW-XNOR match logic pulls to ground (instead of VDD) on a match. This saves one level of inverters if the matchline is connected to domino logic. However, the transistors pulling to VDD will have to be sized larger resulting in more capacitance to drive on the tag lines and may thus not be the best low power solution.

According to an embodiment of the present invention, the DW-XNOR pulls to VDD on a match (FIG. 3*b*). More specifically, signal tag0 311 is bit 0 of the external word to be matched against. Signal tag0b 312 is the inverse signal of tag0 (except during precharge when both are low). Signal data0 314 is bit 0 of the word stored in memory. Signal data0b 316 is the inverse of signal data0. Arguments tag1-tagN, tag1b-tagNb, data1-dataN, data1b-dataNb 318 are similar.

The transistor stacks for tag0 & data0 and data0b & tag0b logically form the XNOR function NOT(tag0 XOR data0). When the XNOR function evaluates to true, a high value is propagated. The transistor stacks for tagib & datai and tagi & dataib, i=1 . . . N, logically form the XNOR function (tagi XNOR datai). When the XNOR function evaluates to false, a low value is propagated.

The function of the whole wired XNOR function is to pull the matchline (which is precharged low) high when the external word (tag bits) matches the word stored in memory (data bits). Initially, signal "pc" is high precharging the matchline to low. At this time tag0 and tag0b are both low so there is no short circuit. At this time tag1-tagN and tag1b-tagNb can be at any value since their associated transistor stacks pull to the same value as the precharge transistor.

When an external tag arrives, the tag0-tagN and tag0b-tagNb signals change value and the wired XNOR function is evaluated. The transistors for tag1-tagN and tag1b-tagNb pull stronger than the transistors for tag0 and tag0b. Therefore, the matchline will be pulled high when there is a match between the external word and the memory word, and remain clamped low if there is a mismatch.

As illustrated in the Table 1 below the matchline can be pulled high in two situations:

1) When the transistor stack for tag0 and data0 conducts and no other transistor stack conducts (case 1); and
2) When the transistor stack for tag0b and data0b conducts and no other transistor stack conducts (case 6).

TABLE 1

| tag0 & data0 | tag0b & data0b | tag1b & data1 | tag1 & data1b | ... | tagNb & dataN | tagN & dataNb | matchline |
|---|---|---|---|---|---|---|---|
| 1 | 0 | 0 | 0 | | 0 | 0 | 1 (case 1) |
| 1 | 0 | 1 | — | | — | — | 0 (case 2) |
| 1 | 0 | — | 1 | | — | — | 0 (case 3) |
| 1 | 0 | — | — | | 1 | — | 0 (case 4) |
| 1 | 0 | — | — | | — | 1 | 0 (case 5) |
| 0 | 1 | 0 | 0 | | 0 | 0 | 1 (case 6) |
| 0 | 1 | 1 | — | | — | — | 0 (case 7) |
| 0 | 1 | — | 1 | | — | — | 0 (case 8) |
| 0 | 1 | — | — | | 1 | — | 0 (case 9) |
| 0 | 1 | — | — | | — | 1 | 0 (case 10) |
| 0 | 0 | — | — | | — | — | 0 (case 11, precharge) |
| 1 | 1 | — | — | | — | — | x (N/A) |

Once the function has finished the evaluation, the tag-lines for tag0 and tag0b are pulled low. Once the environment reads a match on the matchline, pc is set high and the matchline is precharged low again. Note that since tag0 and tag0b are pulsed and have been pulled low again there is no short circuit condition during precharge.

In cases 2 to 5 and 7 to 10, there is a short circuit between one stack pulling to VDD and one or several stacks pulling to GND. To reduce the power consumption due to the short circuit condition, the signals tag0 and tag0b are pulsed, e.g., they both go low after enough time is given for the function to evaluate. Thus, the short circuit condition exists only for a short period of time.

The present invention can also use a DW-XNOR pulling to GND with a limited pulsed XNOR-AND function to reduce the chance of short circuit current (still, only tag-bit 0 needs to be pulsed). This structure is illustrated in FIG. 3*d*, with the logic shown in Table 2. Since N-mos pulls to GND better than VDD, a stack height of 2 to 4 XNOR match functions pulling to GND would then be of about the same strength as one match function pulling to VDD (depending on transistor technology). This structure has the potential of allowing minimal transistor size for all match transistors, thus reducing tag-line drive capacitance. In addition, the chance of a short circuit is reduced, depending on the stack height of the AND function. The probability of short circuit is anywhere from about 50% when the stack height is one match function (tag 0), to 0% when the AND function incorporates all match functions (tags 0 . . . N).

TABLE 2

| tag0 & data0 | tag0b & data0b | tagi & datai | tagib & dataib | ... | tagi+1b & datai+1 | tagi+1 & datai+1b | ... | tagNb & dataN | tagN & dataNb | matchline |
|---|---|---|---|---|---|---|---|---|---|---|
| 0 | 1 | 0 | 1 |  | 0 | 0 |  | 0 | 0 | 0 (case 1) |
| 0 | 1 | 1 | 0 |  | 0 | 0 |  | 0 | 0 | 0 (case 2) |
| 1 | 0 | 0 | 1 |  | 0 | 0 |  | 0 | 0 | 0 (case 3) |
| 1 | 0 | 1 | 0 |  | 0 | 0 |  | 0 | 0 | 0 (case 4) |
| 0 | 1 | 0 | 1 |  | 1 | — |  | — | — | 1 (case 5) |
| 0 | 1 | 0 | 1 |  | — | 1 |  | — | — | 1 (case 6) |
| 0 | 1 | 0 | 1 |  | — | — |  | 1 | — | 1 (case 7) |
| 0 | 1 | 0 | 1 |  | — | — |  | — | 1 | 1 (case 8) |
| 0 | 1 | 1 | 0 |  | 1 | — |  | — | — | 1 (case 9) |
| 0 | 1 | 1 | 0 |  | — | 1 |  | — | — | 1 (case 10) |
| 0 | 1 | 1 | 0 |  | — | — |  | 1 | — | 1 (case 11) |
| 0 | 1 | 1 | 0 |  | — | — |  | — | 1 | 1 (case 12) |
| 1 | 0 | 0 | 1 |  | 1 | — |  | — | — | 1 (case 13) |
| 1 | 0 | 0 | 1 |  | — | 1 |  | — | — | 1 (case 14) |
| 1 | 0 | 0 | 1 |  | — | — |  | 1 | — | 1 (case 15) |
| 1 | 0 | 0 | 1 |  | — | — |  | — | 1 | 1 (case 16) |
| 1 | 0 | 1 | 0 |  | 1 | — |  | — | — | 1 (case 17) |
| 1 | 0 | 1 | 0 |  | — | 1 |  | — | — | 1 (case 18) |
| 1 | 0 | 1 | 0 |  | — | — |  | 1 | — | 1 (case 19) |
| 1 | 0 | 1 | 0 |  | — | — |  | — | 1 | 1 (case 20) |
| 0 | 0 | — | — |  | — | — |  | — | — | 1 (precharge) |
| 1 | 1 | — | — |  | — | — |  | — | — | x (N/A) |
| — | — | 1 | 1 |  | — | — |  | — | — | x (N/A) |

In addition to precharging and discharging the matchline, prior art CAM match logic consumes significant power while driving its high capacitance tag lines. Irrespective of what CAM logic is used, power savings can be achieved, according to an embodiment of the present invention, by clock gating the tag latches whenever a tag is not valid (e.g., there is no new result from the execution units for a given cycle). Thus a tag is only latched when the tag is valid, thus saving power by disabling the latches, as well as by not driving the tag-lines and evaluating the XNOR match functions.

Figure 6B:
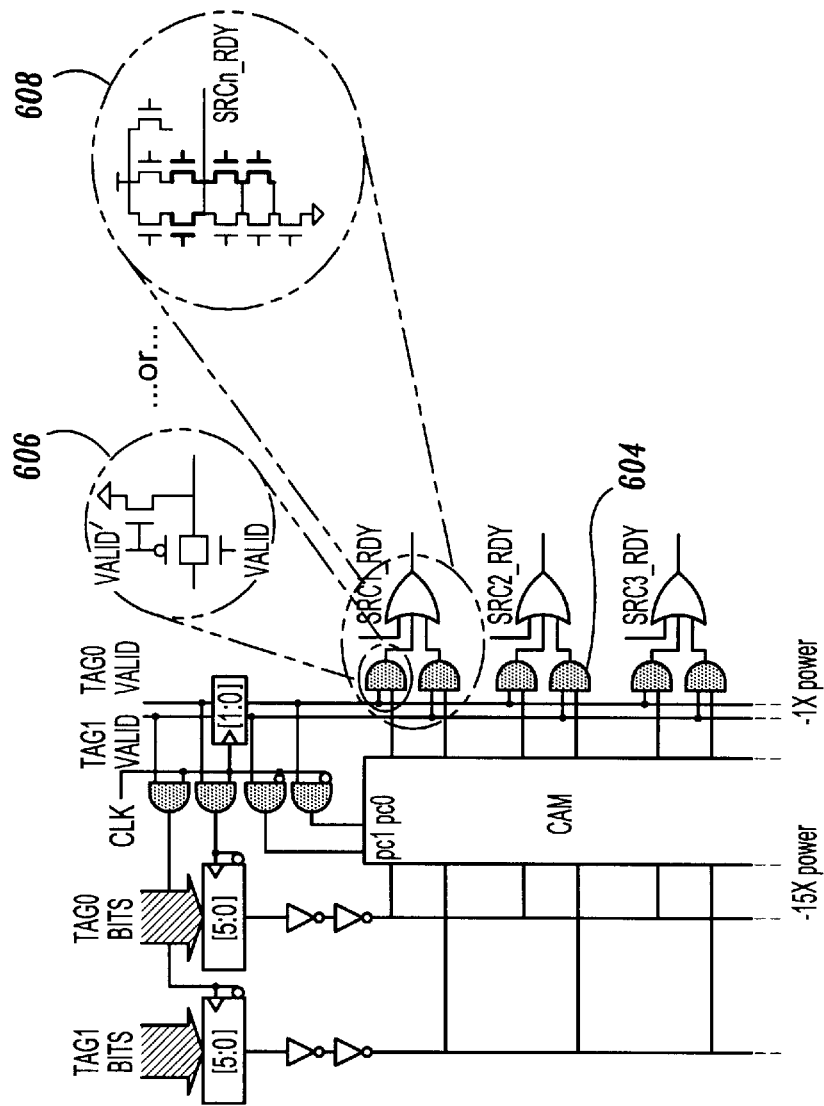
FIG. 6b is a diagram illustrating circuits for gating the CAM match logic when a tag is invalid, showing an embodiment of the present invention for a dynamic wired XNOR CAM.
Figure 6A:
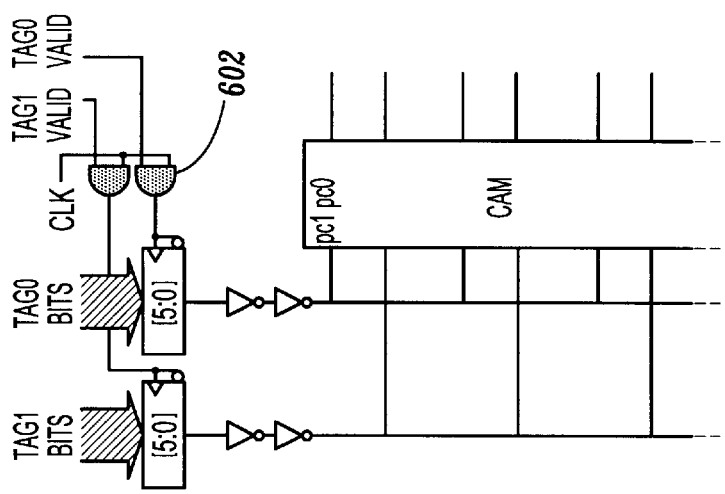
FIG. 6a is a diagram illustrating circuits for gating the CAM match logic when a tag is invalid, showing an embodiment of the present invention for a dynamic wired XNOR CAM according to one embodiment of the present invention.
Figure 7:
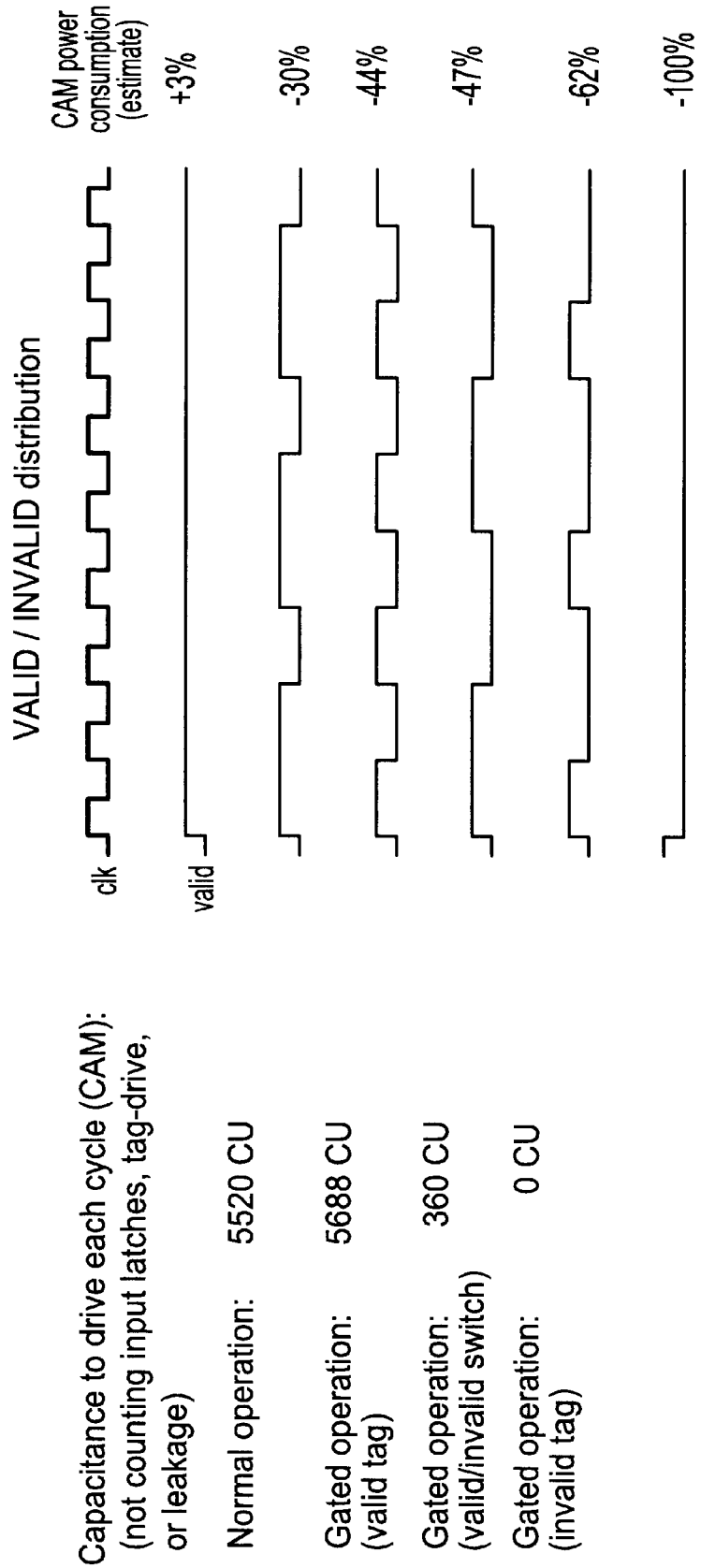
FIG. 7 is a timing diagram showing theoretically estimated power savings achieved by gating the CAM match logic for a dynamic wired XNOR CAM.

Referring to FIG. 6, when tag-gating is used for the prior art DW-XNOR CAM, the CAM match line is disabled through an AND function when the tag is invalid. The AND function (illustrated as shaded gates, e.g., 604) is connected to the valid signal and the matchline such that its output is low whenever the tag is invalid, and otherwise propagating the value of the matchlin. This is needed to clear the propagated match result since the matchline will remain high. However, since the high capacitance matchline itself is not discharged, less power is consumed. Also, the reset logic (606 or 608) only switches (actively consumes power) when tag valid changes value. While tag valid stays at the same value, the reset logic (606 or 608) does not actively consume any power (although some passive resistance and capacitance is added). While a tag is invalid, the only switching activity for the associated match logic is the flip-flop that latches the valid bit. As .an alternative to AND gates the reset logic can either be implemented as a passgate 606, or built into the ready logic 608 as illustrated in FIG. 6b. In either case, the delay overhead is small. A valid signal normally already exists internal to the execution units, so there is no additional complexity introduced by providing such a signal to the issue unit (except routing).

When tag-gating is used for the DW-XNOR CAM in the present invention, there is no need for extra reset logic as the matchline will remain discharged. The only additional logic needed to tag-gate a DW-XNOR CAM is the AND function needed to gate the clock to the tag latches (602 in FIG. 6).

Note that for the tag-gating, the valid signal should be generated by the execution units at the falling clock edge (in the middle of the cycle), so as not violate the clock pulse width constraints of the tag latches in case valid goes from high to low, or generate a false clock pulse when going from low to high. If an early version of the clock to the tag latches can be used, then there is no delay overhead associated with the tag-gating. Theoretically estimated power savings for a prior art DW-XNOR CAM using the tag-gating of the present invention is given in FIG. 7. For a DW-XNOR CAM (not shown) there is no extra logic associated with the tag-gating, thus the power savings will be directly proportional to the tag valid and mismatch frequency.

Figure 8:
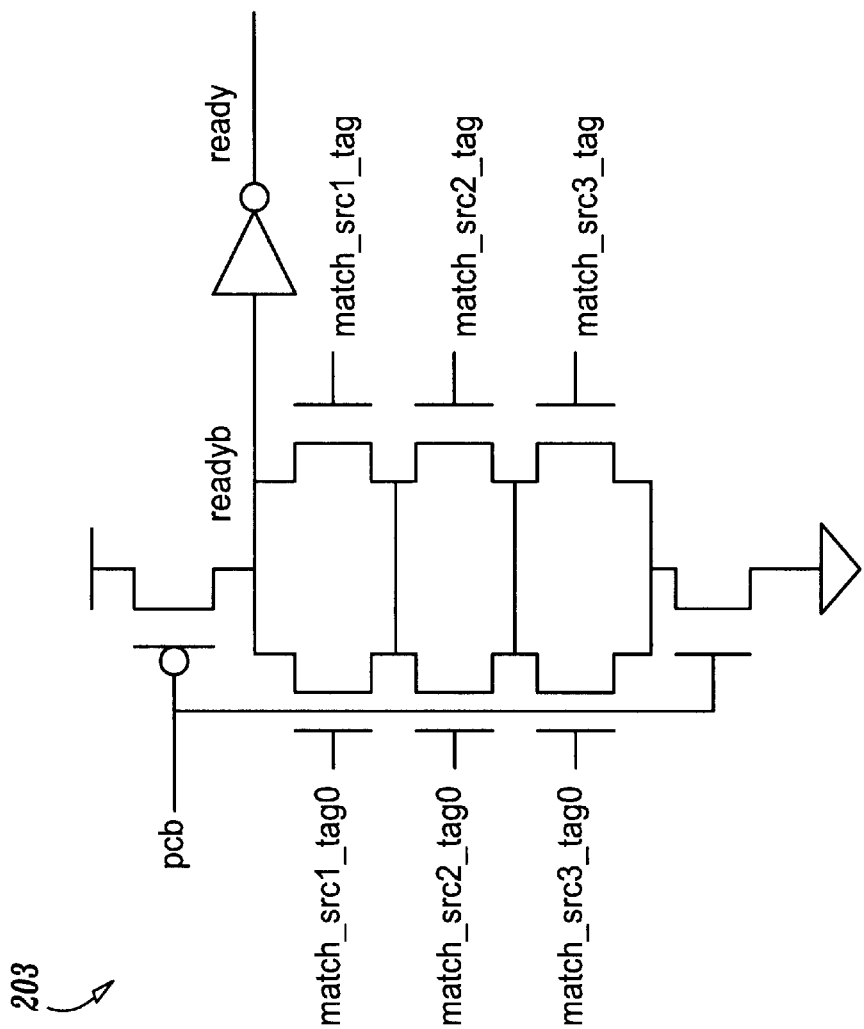
FIG. 8 is a circuit diagram for a domino ready logic according to one embodiment of the present invention.

In one embodiment of the present invention, the ready logic is implemented as an OR-AND domino gate. This configuration is low-power since it is only precharged once the instruction has been granted to issue, e.g., the precharge transistors are not driven by the clock. The precharge transistors are thus driven by the grant signal for their associated queue entry. Since the domino gate is triggered by monotonic data signals (remember that the match results are sticky bits), there is also no need for an evaluation signal that samples the data signals each cycle, further saving power. The domino gate for the ready logic is illustrated in FIG. 8. The footing transistor can be removed if staggered precharge is used (although available cycle time might not always allow this).

After all source operands are available for an instruction, an arbitration process determines whether the instruction has permission to issue. This arbitration process is implemented by the select logic. The select logic generates a high "read" signal for the queue entry that wins the arbitration. The read signal is connected to the wordline of the RAM including the instruction to be issued.

In a preferred embodiment of the present invention, the CAM structures are implemented in conjunction with the select logic desired in the commonly assigned U.S. Pat. No. 6,512,397, entitled "Circuit Structures for High-Speed Low-Power Select Arbitration" incorporated by reference herein in its entirety. The select arbitration is based on selectively precharged domino logic having multiple levels of domino gates.

According to the example shown in FIG. 1, the instructions stored in the RAM portion of the issue queue can be wide as they include the operand code, immediates, etc. Even at a queue size of 16–32 entries, the capacitance that needs to be driven for a read or write operation is significant. The present invention presents approaches to reduce the capacitance for reads and writes by banking the bitlines and segmenting the wordlines of the RAM.

Figures 9A, 9B:
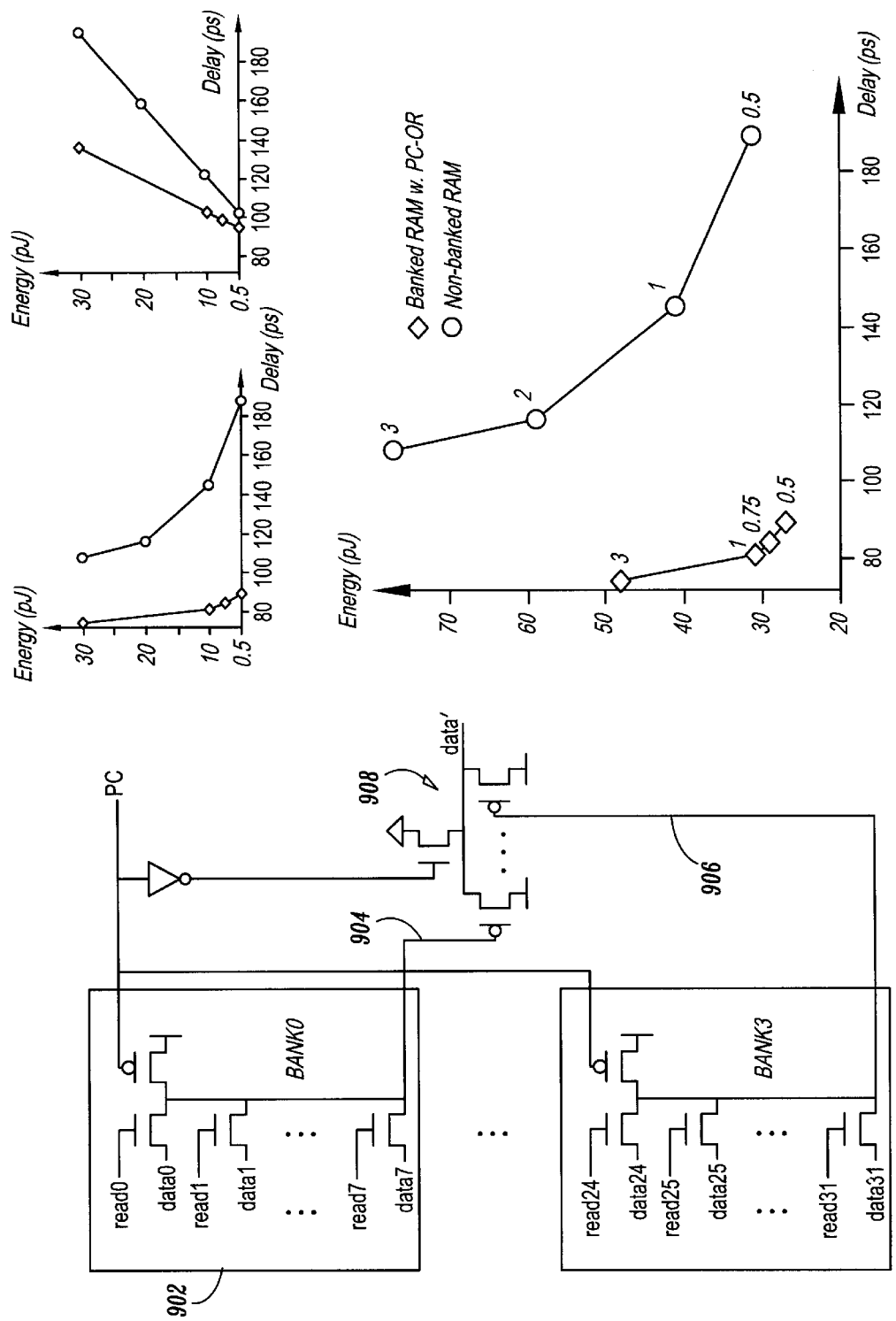
FIG. 9a is a circuit diagram for a banked RAM according to still another embodiment of the present invention.
FIG. 9b is a graph of the power and speed of non-banked RAM and banked RAM.

One embodiment of the present invention provides a combined high-speed and low-power method of reading a RAM by dividing the wordlines into banks as.illustrated in FIG. 9a. With a banked approach only one bank, e.g., 902, needs to be discharged and precharged upon reading a 0 (when reading a 1 all nodes remain at their old values). The data outputs 904–906 of the banks in a banked RAM are merged to a single output through a precharged OR gate 908. When a 32 entry RAM is divided into four banks, reading a 0 takes about the same amount of power as discharging and precharging one bank and the domino OR gate, which is equal to discharging and charging two banks (a bank and the domino OR gate have roughly the same diffusion capacitance for a 32 entry queue divided into 4 banks). In the present embodiment the banks need separate precharge transistors which adds to the total precharge gate capacitance.

The speed and power savings for a banked versus a non-banked RAM is illustrated in FIG. 9b (simulated with a transistor level simulator). The banked approach can achieve speeds that are typically not possible with a non-banked approach unless sense-amps are used. The banked approach also consumes less power at speeds comparable to a non-banked approach. A staggered precharge is used to avoid having to foot the precharged OR-gate.

According to the present invention, a bit field stored in the issue queue may not be used by all instructions. When a valid bit is stored within a field of the instruction, indicating whether the field contains information to be used during execution of the instruction, then the read and write buffering of the associated wordline segments of the field can be turned on or off depending on whether the field is used or not. This approach saves power in at least two ways. Less gate capacitance needs to be driven on a read or write, as some branches of the buffer tree are gated, and because the read or write signal is gated, no actual write or read is performed. This means that the storage elements do not switch on a write, and bitlines are not discharged on a read. When the input latches that capture the instruction are also gated in a segmented fashion, the bitlines will not be charged or discharged on a write. One example of a field type where such segmentation of the wordline can be used is for immediates.

The present invention has addressed circuit structures to reduce power consumption during active computation in datapath logic in the context of an issue unit based on a CAM/RAM structure. Low power circuit structures were developed for wake up and instruction storage logic.

As part of the wake up device, a circuit structure for CAM match logic was developed and shown to consume about 20% of the power of regular prior art CAM structures at comparable speed. The CAM structure also interfaces well with logic dependent on the matchline result, enabling data triggered domino logic rather than logic where data needs to be sampled. A method for gating the tag latches was also developed. The method can achieve considerable power benefits at very little overhead. Low power methods for instruction storage in a RAM structure were also investigated. Banked bitlines and segmented wordlines were proposed to reduce capacitance that needs to be driven during reads and writes.

Having described embodiments of a system and method for providing low-power circuit structures for instruction wake up and instruction storage in a high-speed issue unit, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method of matching two data sources through a wired exclusive-nor (XNOR) function comprising the steps of:

discharging a first tag line and a second tag line associated with a first tag bit;

precharging a matchline, connected to a plurality of tag match functions, to a first potential, wherein each tag match function comprises one or more match logic devices;

reading a plurality of tag bits, including the first tag bit, and corresponding data bits, onto a plurality of corresponding tag lines and data lines respectively; and determining a match between each tag bit and data bit, wherein the matchline is pulled to a second potential upon each match logic device indicating a match, and wherein the matchline is held at the first potential upon any match logic device indicating a mismatch.

2. The method of claim 1, wherein each match logic device has a pulling strength, wherein the pulling strengths are ratioed, the match logic devices pulling to the first potential being stronger than the match logic devices pulling to the second potential, wherein upon the match logic devices simultaneously pulling to different potentials, the matchline is clamped at the first potential.

3. The method of claim 1, further comprising the step of pulsing a tag line by resetting the tag line to a logic 0 after the match logic devices have evaluated whether the corresponding tag bit has a logic value of 1.

4. The method of claim 3, wherein pulsing a tag line further comprises the steps of:

latching a tag bit; and resetting a latch to a value of logic 0 upon determining the tag bit to be a value of logic 1 after the match logic devices have evaluated whether the corresponding tag bit has a logic value of 1.

5. The method of claim 3, further comprising the steps of:

pulling the matchline partially towards the second potential upon determining a match for each tag bit; and pulling the matchline to the second potential using a sense-amplifier.

6. The method of claim 1, wherein the XNOR function is a static wired XNOR function, the method further comprising the steps of:

pulling, with at least one tag match function, the matchline to the second potential upon evaluating a match; and pulling, with at least one tag match function, the matchline to the first potential upon evaluating a mismatch, wherein the matchline implements a static wired XNOR function.

7. The method of claim 1, wherein the wired XNOR function is implemented as a dynamic XNOR-AND function, the method further comprising the steps of:

pulling, with a set of tag match functions, to the first potential; and pulling, through an AND structure of tag match functions, to the second potential, wherein one or more tag match functions are connected to one another in series forming an AND(XNOR(tag[i]), . . . ,XNOR(tag[i+j])) function, where i and j indicate the corresponding tag bits of the tag match functions.

8. The method of claim 1, wherein the first potential is ground and the second potential is VDD.

9. The method of claim 1, wherein the first potential is VDD and the second potential is ground.

10. The method of claim 1, further comprising the steps of:

storing a plurality of data entries in a memory, wherein a matchline with associated match logic is replicated for each data entry;

storing a tag in a latch;

implementing, through the memory and the match logic, a content addressable memory; and implementing, through the matchline of each data entry, a wake up function.

11. The method of claim 10, further comprising the step of inhibiting the evaluation of a matchline, wherein the content addressable memory device comprises a gating device connected to a tag valid signal and a clock for gating the clock to the tag latch, thus avoiding latching a new tag when the tag is invalid thus inhibiting the evaluation of the corresponding matchlines.

12. The method of claim 1, wherein the precharge signal of each matchline is a clock.

13. The method of claim 1, wherein the precharge signal of each matchline is a delayed derivative of the matchline signal such that a self-resetting structure is implemented.

14. A wake up device which detects source operands, comprising:

a content addressable memory based on a wired XNOR match function, including at least two tag lines for receiving data from a results tag latch and a tag drive;

a first tag bit and data bit connected to a first match function, the first match function pulling to a first potential upon evaluating a match;

at least a second tag bit and data bit connected to a second match function, the second match function pulling to a second potential upon evaluating a mismatch; and a precharged matchline connecting the tag match functions, pulled to the second potential, the precharged value adapted to indicate a mismatch of the match function.

15. The wake up device of claim 14, wherein the content addressable memory is dynamic wired XNOR based.

16. The wake up device of claim 14, wherein the content addressable memory is static wired XNOR based further comprising:

a first tag bit and data bit input to a first tag match function, the first tag match function pulling to a first potential upon a match;

the first tag bit and data bit input to a second tag match function, the second tag match function pulling to a second potential upon a mismatch; and at least a second tag bit and data bit input to a third tag match function connected to the second potential, the third tag match function pulling to the second potential upon a mismatch.

17. The wake up device of claim 14, wherein the content addressable memory is dynamic wired XNOR-AND based further comprising:

a logic structure based on an AND function including a plurality of XNOR tag match functions each connected to an associated tag bit and data bit, the tag match functions connected in series, the logic structure pulling to the first potential upon all tag match functions in the logic structure indicating a match of their corresponding tag bit and data bit;

zero or more successive tag match functions connected to associated tag bits and data bits, the tag match functions pulling to the second potential upon a mismatch;

an end of the AND logic structure connected to the matchline; and a precharge transistor connected to a precharge signal, the matchline, and to the second potential for pulling the matchline to the second potential.

18. The wake up device of claim 14, further comprising an AND function connected to a tag valid signal and a clock for gating the clock to the results tag latch.

19. The wake up device of claim 14, further comprising a ready logic in the form of a plurality of transistors each connected to a content addressable memory matchline, wherein the transistors are connected in parallel-series stacks forming a domino gate, wherein a first end of the OR-AND gate is connected to a footing transistor, the footing transistor further connected to a precharge signal and to the second potential, and a second end of the gate connected to an output node, a precharge transistor connected to the output node, a precharge signal, and the first potential, the ready logic detecting the matching of multiple entries in the content addressable memory.

20. The wake up device of claim 14, wherein the first potential is ground and the second potential is VDD.

21. The wake up device of claim 14, wherein the first potential is VDD and the second potential is ground.

* * * * *